(12) United States Patent
Wolk et al.

(10) Patent No.: US 7,759,042 B2
(45) Date of Patent: Jul. 20, 2010

(54) DONOR FILMS WITH PATTERN-DIRECTING LAYERS

(75) Inventors: Martin B. Wolk, Woodbury, MN (US); John E. Potts, Woodbury, MN (US); Yingbo Li, Woodbury, MN (US); Khanh T. Huynh, Eagan, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 12/557,675

(22) Filed: Sep. 11, 2009

(65) Prior Publication Data

US 2009/0322219 A1 Dec. 31, 2009

Related U.S. Application Data

(63) Continuation of application No. 11/556,719, filed on Nov. 6, 2006, now Pat. No. 7,604,916.

(51) Int. Cl.
*G03F 7/00* (2006.01)
*G03F 7/004* (2006.01)

(52) U.S. Cl. .............. 430/200; 430/270.1; 430/273.1; 430/330

(58) Field of Classification Search ............ 430/200, 430/270.1, 273.1, 330
See application file for complete search history.

(56) References Cited

U.S. PATENT DOCUMENTS

| | | | |
|---|---|---|---|
| 5,725,989 | A | 3/1998 | Chang et al. |
| 6,008,827 | A | 12/1999 | Fotland |
| 6,214,520 | B1 | 4/2001 | Wolk et al. |
| 6,284,425 | B1 | 9/2001 | Staral et al. |
| 6,468,715 | B2 | 10/2002 | Hoffend, Jr. et al. |
| 6,586,153 | B2 | 7/2003 | Wolk et al. |
| 6,866,979 | B2 | 3/2005 | Chang et al. |
| 7,115,351 | B2 | 10/2006 | Kishimoto |
| 2005/0048295 | A1 | 3/2005 | Kim et al. |
| 2006/0188697 | A1 | 8/2006 | Lee |

FOREIGN PATENT DOCUMENTS

KR 10-0731767 6/2007

OTHER PUBLICATIONS

C. DeRosa, et al.; "Microdomain patterns from directional eutectic solidification and epitaxy", Nature 405, 433-37 (2000).

A. Ullman, "Formation and structure of self-assembled monolayers", Chem. Rev. 95, 1533-54 (1996).

(Continued)

*Primary Examiner*—Amanda C. Walke

(57) ABSTRACT

Laser induced thermal imaging (LITI) donor films, and methods of preparing them, having a substrate, a light-to-heat conversion layer, and a pattern-directing layer. The pattern-directing layer can include patterns of self-assembled monolayer regions, hydrophilic and hydrophobic regions, positively or negatively charged regions, or a series of raised or recessed features. It can also be used to generate charge patterns and magnetic patterns. The pattern-directing layer causes patterning of a transfer layer applied to it, resulting in a templated transfer layer. When imaged, the LITI donor film transfers at least a portion of the templated transfer layer to a permanent receptor while maintaining the pattern substantially intact in the transferred portion.

10 Claims, 4 Drawing Sheets

OTHER PUBLICATIONS

P. Mendes and J. Preece, "Precision chemical engineering: integrating nanolithography and nanoassembly", Curr. Opinion in Colloid and Interface Science 9, 236-48 (2004).

A. Karim et al., "Phase-Separation-Induced Surface Patterns in Thin Polymer Blend Films," Macromolecules 1998, vol. 31, pp. 857-62 (American Chemical Society 1998).

Cheng et al., "Templated Self-Assembly of Block Copolymers: Top-Down Helps Bottom-Up," Ad. Mater, vol. 18, 2505-2521 (Wiley-VCH Verlag GmbH & Co., KgaA, Weinheim 2006).

Wu et al., "Toward Large-Scale Alignment of Electrohydrodynamic Patterning of Thin Polymer Films," Adv. Funct. Mater, vol. 16, pp. 1992-1999 (Wiley-VCH Verlag GmbH & Co. KGaA, Weinheim 2006).

Springer Handbook of Nanotechnology, ISBN 3-540-01218-4, pp. 185-200 (Springer-Verlag Berlin Heidelberg 2004).

Section 4.3.9 entitled "Printing Plates for Digital Imaging" in Handbook of Print Media, Technologies and Production Methods, ISBN 3-540-67326-1 (Springer-Verlag Berlin Heidelberg 2001).

Handbook of Print Media, Technologies and Production Methods, ISBN 3-540-67326-1, pp. 675-710 (Springer-Verlag Berlin Heidelberg 2001).

U.S. Appl. No. 11/551,276 entitled "Structured Thermal Transfer Donors" and filed Oct. 20, 2006.

A. Kumar and G. Whitesides; Appl Phys. Lett. 63, 2002 (1993) Microcontact printing.

Fichet et al., "Self-Organized Photonic Structures in Polymer Light-Emitting Diodes," Adv. Mater. vol. 16, No. 21 (Wiley-VCH Verlag GmbH & Co. KGaA, Weinheim 2004).

A. Karim et al., "Phase Separation of Ultrathin Polymer Blend Films on Patterned Substrates," Physical Review E, vol. 57, No. 6 (The American Physical Society 1998).

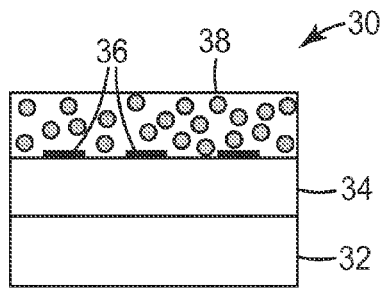
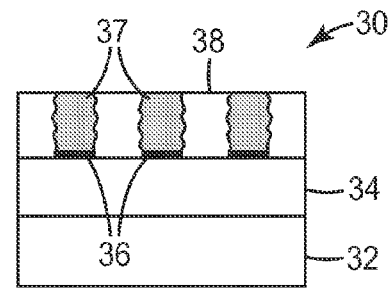
FIG. 5a          FIG. 5b
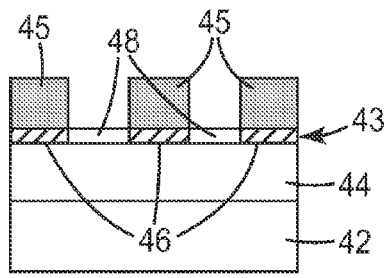
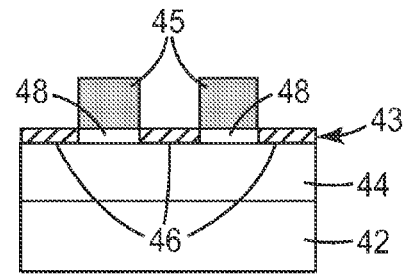
FIG. 6a          FIG. 6b
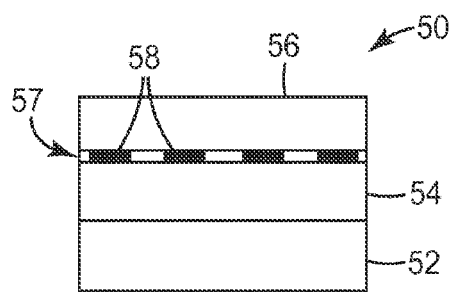
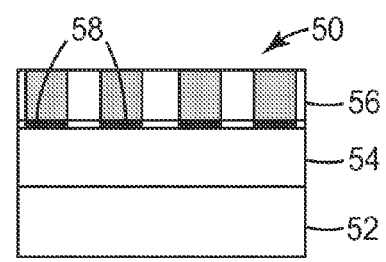
FIG. 7a          FIG. 7b

DONOR FILMS WITH PATTERN-DIRECTING LAYERS

CROSS REFERENCE TO RELATED APPLICATIONS

This application is a continuation of U.S. Ser. No. 11/556,719, filed Nov. 6, 2006, now U.S. Pat. No. 7,604,916 now allowed, the disclosure of which is incorporated by reference in its entirety herein.

FIELD OF INVENTION

The present invention relates to methods of fabricating and imaging laser induced thermal imaging (LITI) donor films having pattern-directing layers.

BACKGROUND

Many electronic and optical devices are formed using layers of different materials stacked on each other. These layers are often patterned to produce the devices. Examples of such devices include optical displays in which each pixel is formed in a patterned array, optical waveguide structures for telecommunication devices, and metal-insulator-metal stacks for semiconductor-based devices.

A conventional method for making these devices includes forming one or more layers on a receptor substrate and patterning the layers simultaneously or sequentially to form the device. In many cases, multiple deposition and patterning steps are required to prepare the ultimate device structure. For example, the preparation of optical displays may require the separate formation of red, green, and blue subpixels. Although some layers may be commonly deposited for each of these types of pixels, at least some layers must be separately formed and often separately patterned. Patterning of the layers is often performed by photo-lithographic techniques that include, for example, covering a layer with a photoresist, patterning the photoresist using a mask, removing a portion of the photoresist to expose the underlying layer according to the pattern, and then etching the exposed layer.

In some applications, it may be difficult or impractical to produce devices using conventional photolithographic patterning. For example, the number of patterning steps may be too numerous for practical manufacture of the device. In addition, wet processing steps in conventional photolithographic patterning may adversely affect integrity, interfacial characteristics, and electrical or optical properties of the previously deposited layers. It is possible that many potentially advantageous device constructions, designs, layouts, and materials are impractical because of the limitations of conventional photolithographic patterning.

SUMMARY

A method of preparing a patterned LITI donor film, consistent with the present invention, includes the steps of providing a substrate having a surface and a light-to-heat conversion layer applied to the surface of the substrate, and applying a pattern-directing layer to the light-to-heat conversion layer.

A patterned LITI donor film, consistent with the present invention, includes a substrate having a surface, a light-to-heat conversion layer applied to the surface of the substrate, and a pattern-directing layer applied to the light-to-heat conversion layer. The LITI donor film can have an optional interlayer disposed between the light-to-heat conversional layer and the pattern-directing layer.

In the method and donor film, the pattern-directing layer causes patterning of a transfer layer applied to it. At least a portion of the transfer layer is capable of transfer to a permanent receptor, and a pattern of the transfer layer in the transferred portion remains substantially intact on the receptor subsequent to the transfer.

BRIEF DESCRIPTION OF THE DRAWINGS

The accompanying drawings are incorporated in and constitute a part of this specification and, together with the description, explain the advantages and principles of the invention. In the drawings.

FIG. 5a is a diagram illustrating a LITI donor film having a SAM as the pattern-directing layer;

FIG. 5b is a diagram illustrating the donor film of FIG. 5a after patterned by the SAM;

FIG. 6a is a diagram illustrating a LITI donor film having a hydrophilic and hydrophobic regions as the pattern-directing layer;

FIG. 6b is a diagram illustrating the donor film of FIG. 6a after patterned by the hydrophilic and hydrophobic regions;

FIG. 7a is a diagram illustrating a LITI donor film having positively or negatively charged regions as the pattern-directing layer;

FIG. 7b is a diagram illustrating the donor film of FIG. 7a after patterned by the positively or negatively charged regions;

DETAILED DESCRIPTION

Embodiments include methods of fabricating LITI donor films having a pattern-directing layer or surface such as the following: a self-assembled monolayer (SAM); a pattern comprising hydrophilic and hydrophobic regions; a pattern comprising positively or negatively charged regions; a pattern comprising a series of raised and or recessed features; and a pattern comprising a spatially varying optical properties (e.g., reflectivity, absorption, polarization, index of refraction). These non-limiting examples of pattern-directing layers may relate to processes of microcontact printing, lithographic printing, electrographic printing, magnetic recording, and intaglio printing. In any of the pattern-directing layers such as those described in the present specification, they can be arranged in a regular pattern, irregular pattern, random pattern, or pseudo-random pattern. The pattern-directing layer causes patterning of another layer such as a transfer layer, and the pattern is preferably substantially retained intact after transfer to a permanent receptor.

Embodiments also include LITI donor films comprising a templated transfer layer, having been patterned by a pattern-directing layer, with features such as physical structures or phase boundaries generated by directed self-assembly via interaction with the underlying assembly directing layer and to optical films prepared using patterned LITI donor films. Examples of applications of films having a pattern-directing layer include electronics (nanoscale features enabling unique, useful quantum effects), optical elements (photonic bandgap structures, near-field storage devices), sensing surfaces for ultrasensitive detection systems, and structures for the detection and manipulation of organisms in cell biology.

As used herein:

The term "device" includes an electronic or optical component that can be used by itself or with other components to form a larger system.

The term "microstructures" refers to features of a surface that have at least one dimension (e.g., height, length, width, or diameter) of less than one millimeter.

The term "nanostructures" refers to features of a surface that have at least one dimension (e.g., height, length, width, or diameter) of less than one micron.

LITI Donor Film and Patterning

Figure 1:
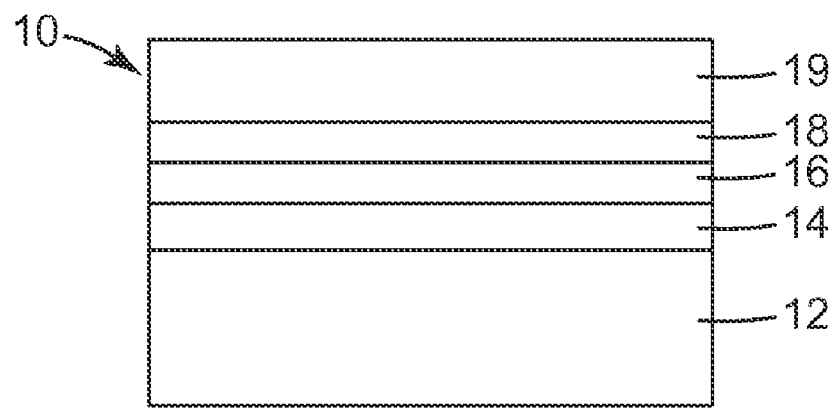
FIG. 1 is a side view illustrating a LITI donor film with a pattern directing layer.
Figure 2:
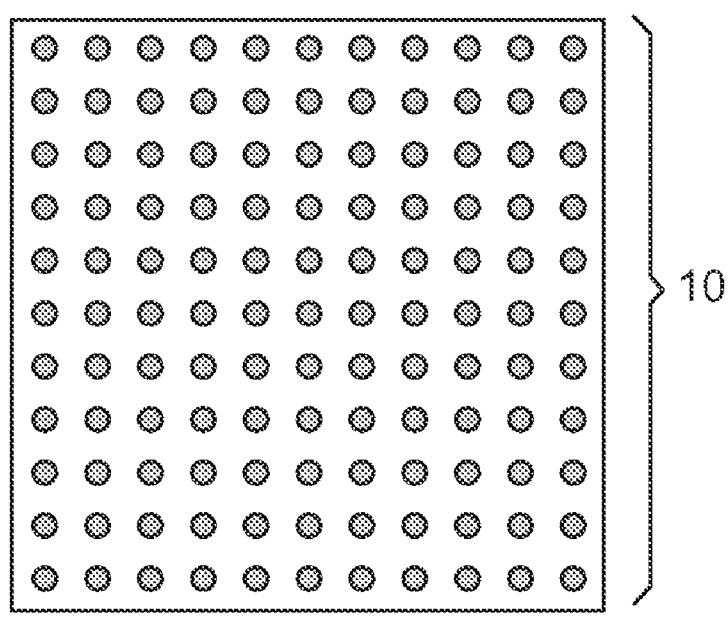
FIG. 2 is a top view illustrating a patterned LITI donor film.

FIG. 1 is a side illustrating a LITI donor film 10. As shown in FIG. 1, LITI donor film 10 typically includes a donor substrate 12, a light-to-heat conversion (LTHC) layer 14, and optional interlayer 16, a pattern-directing layer 18, and a transfer layer 19. Examples of pattern-directing layers are described below. FIG. 2 illustrates in a top view a pattern resulting from pattern-directing layer 18. The pattern is shown as a group of circles for illustrative purposes only; the pattern-directing layer can include a pattern of any type of geometric shape or shapes in any type of regular or irregular arrangement. The term "pattern-directing layer" refers to a layer in a donor film that can cause another layer to become patterned in any type and configuration of pattern. The term "templated layer" refers to a layer that has been patterned by a pattern-directing layer. A pattern-directing layer may be itself a separate layer or it may be co-extensive with another layer such as the LTHC or optional interlayer.

FIG. 2 is a top view of LITI donor film 10 illustrating the pattern-directing layer having caused patterning of another layer as represented by the shaded circles. For example, the shaded circles may represent a continuous phase region caused by the pattern-directing layer, and the area between the circles may represent a discontinuous phase region.

Various layers of an exemplary LITI donor film, and methods to image it, are more fully described in U.S. Pat. Nos. 6,866,979; 6,586,153; 6,468,715; 6,284,425; and 5,725,989, all of which are incorporated herein by reference as if fully set forth.

The donor substrate 12 provides support for the layers of the thermal transfer donor (film 10). One suitable type of polymer film is a polyester film, for example, polyethylene terephthalate (PET) or polyethylene naphthalate (PEN) films. However, other films with sufficient optical properties can be used, if light is used for heating and transfer. The donor substrate, in at least some instances, is flat so that uniform coatings can be formed. The donor substrate is also typically selected from materials that remain stable despite heating of any layers in the thermal transfer donor (e.g., an LTHC layer). A suitable thickness for the donor substrate ranges from, for example, 0.025 millimeters (mm) to 0.15 mm, preferably 0.05 mm to 0.1 mm, although thicker or thinner donor substrates may be used.

The LTHC layer 14 typically includes a radiation absorber that absorbs incident radiation (e.g., laser light) and converts at least a portion of the incident radiation into heat to enable transfer of the pattern-directing transfer layer from the thermal transfer donor to the permanent receptor. Alternatively, radiation absorbers can be included in one or more other layers of the donor film in addition to or in place of the LTHC layer. Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of other suitable radiation absorbers can include carbon black, metal oxides, and metal sulfides.

The optional interlayer 16 may be used in the thermal transfer donor to minimize damage and contamination of the transferred portion of the pattern-directing transfer layer and may also reduce distortion in the transferred portion of the transfer element. The interlayer may also influence the adhesion of the transfer element to the rest of the thermal transfer donor. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer element (e.g., the nanostructured layer and, optionally, the release layer). Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer. The interlayer may contain additives, including, for example, photoinitiators, surfactants, pigments, plasticizers, and coating aids.

The transfer layer 19 typically includes one or more layers for transfer to a receptor. Preferably, the pattern within the transfer layer 19, as determined by pattern-directing layer 18, is maintained substantially intact after transfer. These one or more layers may be formed using organic, inorganic, organometallic, and other materials. Organic materials include, for example, small molecule materials, polymers, oligomers, dendrimers, and hyperbranched materials. The thermal transfer element can include a transfer layer that can be used to form, for example, light emissive elements of a display device, electronic circuitry, resistors, capacitors, diodes, rectifiers, electroluminescent lamps, memory elements, field effect transistors, bipolar transistors, unijunction transistors, metal-oxide semiconductor (MOS) transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters for signal processing (e.g., add-drop filters, gain-flattening filters, cut-off filters, and the like), optical filters, mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example the combination of field effect transistors and organic electroluminescent lamps as an active matrix array for an optical display. Other items may be formed by transferring a multi-component transfer assembly or a single layer.

A permanent receptor for receiving transfer layer 19 may be any item suitable for a particular application including, but not limited to, transparent films, display black matrices, active matrix and passive matrix flat panel display backplanes, metals, semiconductors, glass, various papers, and plastics. Examples of receptor substrates include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated).

For thermal transfer using radiation (e.g., light), a variety of radiation-emitting sources can be used with LITI donor film. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (e.g. $\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 microsecond to 100 microseconds and laser fluences can be in the range from, for example, about 0.01 J/cm$^2$ to about 1 J/cm$^2$. During imaging, the thermal transfer element is typically brought into intimate contact with a permanent receptor adapted to receive at least a portion of the pattern-directing transfer layer. In at least some instances, pressure or vacuum may be used to hold the thermal transfer element in intimate contact with the receptor. A radiation source may then be used to heat the LTHC layer or other layers containing radiation absorbers in an image-wise fashion (e.g., digitally or by analog exposure through a mask) to perform image-wise transfer of the transfer layer from the thermal transfer element to the receptor according to a pattern.

Figure 3A:
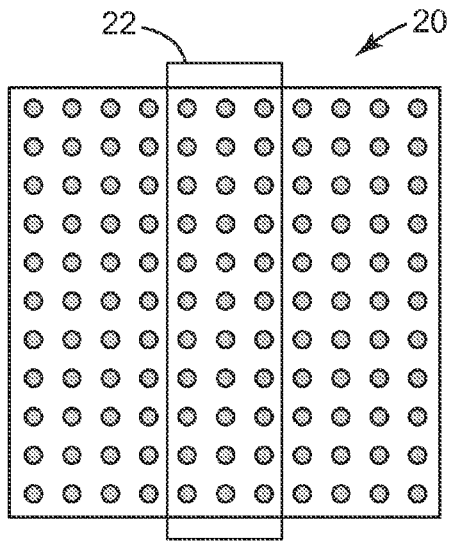
FIG. 3A is a top view diagram illustrating a laser exposed patterned LITI donor film having a pattern-directing layer before selective thermal transfer to a permanent receptor.
Figure 3B:
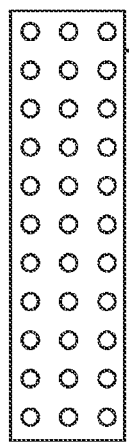
FIG. 3B is a top view diagram illustrating selective thermal transfer of a discontinuous phase in the LITI donor film of FIG. 3A.
Figure 3C:
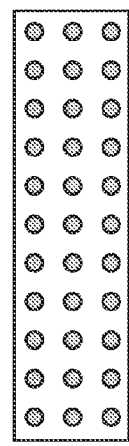
FIG. 3C is a top view diagram illustrating selective thermal transfer of a continuous phase and a discontinuous phase in the LITI donor film of FIG. 3A.
Figure 3D:
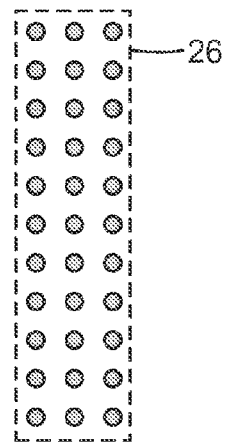
FIG. 3D is a top view diagram illustrating selective thermal transfer of a continuous phase in the LITI donor film of FIG. 3A.

FIGS. 3A-3D are top view diagrams illustrating selective thermal transfer of a laser exposed patterned LITI donor film bearing a phase separated transfer layer derived from a SAM before and after transfer to a permanent receptor. FIG. 3A is a top view illustrating a thermal transfer element 20 having an imaged area 22. FIGS. 3B-3D are diagrams illustrating transferred portions 24-26, respectively, of the donor film after imaging with a laser scan line in imaged area 22. In particular, portion 24 includes the transferred discontinuous phase only (FIG. 3B), portion 25 includes the transferred discontinuous and continuous phases (FIG. 3C), and portion 26 includes the transferred continuous phase only (FIG. 3D).

Figure 4A:
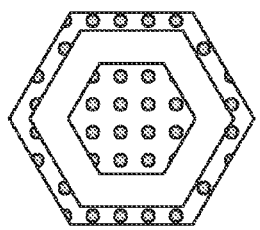
FIGS. 4A-4C are top view diagrams illustrating permanent receptors bearing transferred array patterns from portions of pattern-directing layers.
Figure 4B:
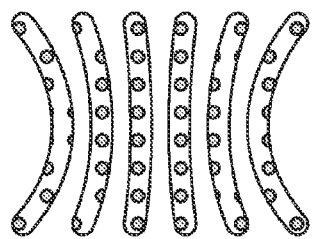
Figure 4C:
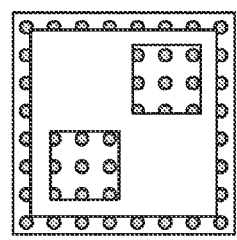

Compound array patterns may be created by combining one or more arrays patterns when laser exposing the thermal transfer element. FIGS. 4A-4C are top view diagrams illustrating permanent receptors bearing exemplary transferred compound array patterns produced by laser exposing the patterned thermal transfer element forming a rectangular array of nanostructures or microstructures produced by a pattern-directing layer. In particular, FIGS. 4A-4C illustrate, respectively, a compound polygonal array, a compound curved array, and a compound rectangular array. Other patterns including any arbitrary pattern are possible.

Pattern-Directing Layers

FIG. 5a is a diagram illustrating a LITI donor film 30 having a substrate 32, LTHC layer 34, a transfer layer 38, and a pattern-directing layer comprised of a pattern of SAM regions 36. As illustrated in FIG. 5a, transfer layer 38, prior to patterning, has a discontinuous phase. FIG. 5b is a diagram illustrating LITI donor film 30 having a templated transfer layer patterned by the SAM regions 36 and having continuous phase regions 37. In film 30, substrate 32 and LTHC layer 34 may correspond with substrate 12 and LTHC layer 14 as described above, and film 30 can optionally include an interlayer such as interlayer 16 between the LTHC layer and pattern-directing layer. Also, film 30 can be constructed and imaged using the exemplary methods described above. Upon imaging film 30 to a permanent receptor using the exemplary imaging methods described above, at least some portions of the SAM regions are transferred to the receptor and the pattern of the SAM regions in the transferred portion preferably remains substantially intact on the receptor subsequent to the transfer. The pattern-directing layer of film 30 can include any two-dimensional pattern of SAM regions.

A LITI imaging process can provide for selective transfer of either continuous or discontinuous phases as determined by, for example, a film strength of the transfer layer. The area patterned by the SAMs may form an array or other pattern of areas in the shape of a cylindrical post. When imaged, the posts alone can be transferred depending upon, for example, a film strength of the transfer layer. For example, with materials having a relatively high film strength, such as metals, the transfer layer can transfer along areas of the continuous phase created by the SAMs, in this case the post-shaped structures. On the other hand, with a relatively weak film strength in the transfer layer, the transfer can occur along the laser scan lines used for imaging, including both the post-shaped structures and portions of the discontinuous phase within the laser scan lines.

Useful SAMs for certain embodiments can be formed on organic or inorganic surfaces. Inorganic surfaces that are useful for supporting SAMs include, for example, metallic or metal oxide surfaces. Examples of useful metals include gold, palladium, platinum, silver, and copper. Examples of useful metal oxides include silicon dioxide and aluminum oxide. Organic surfaces that are useful for supporting SAMs are advantageously oxidized before application of the SAM, for example by exposure to an oxygen plasma. Examples of useful SAM-forming molecules, according to certain embodiments, include alkylthiols, organochlorosilanes, organoalkoxysilanes, and alkylphosphonic acids. Useful SAM-forming molecules include hydrocarbons, fluorocarbons, and partially fluorinated compounds. SAMs based on fluorocarbon or partially fluorinated molecules are more thermally stable than hydrocarbon molecules and are therefore more useful in cases where it is desired that the SAM layer remain intact after thermal transfer. SAMs based on fluorocarbon or partially fluorinated molecules are more useful for tailoring the structure-directing properties of the SAM pattern for certain polymer blends (i.e., when the SAM pattern directs phase separation of the polymer blend or when the polymer blend is applied as an overcoat on the SAM pattern), relative to the properties of SAMs based on hydrocarbon molecules. Useful SAM-forming molecules that have a head group that attaches chemically to the surface on which the SAM is formed (e.g., a thiol head group or a trichlorosilane head group), together with a tail section (e.g., a linear alkane chain including 3 to 20 carbon atoms) that takes on order in its arrangement with neighboring molecules, may further include a reactive terminal functional group on the tail. The reactive terminal functional group may be useful for chemically binding the SAM to an overlayer.

SAMs may be created on a LITI donor film using a variety of methods. For example, a SAM can be created by coating an additional thin, approximately 50 nanometer, layer of $SiO_2$, followed by a standard microcontact printing technique to selectively deposit and chemically bond the coupling agent 7-octenyltrichlorsilane to the $SiO_2$ surface of the donor film. The result is a donor film with a nano- or micro-patterned surface having hydrophilic ($SiO_2$) and hydrophobic (7-octenyltrichlorosiloxy) regions printed by a microcontact stamp or printing plate.

Another method for creating SAMs is the exploitation of the affinity of thiols for gold surfaces. First, a thin coating of gold is deposited on top of the LITI donor film. At this point, an alkyl, aryl, or alkenyl thiol is used to create the SAM. Microcontact printing or another suitable method could be used to apply the thiol. Microcontact printing is described in, for example, the following reference: A. Kumar and G. Whitesides; Appl. Phys. Lett. 63, 2002 (1993). Alternatively, the gold surface could be etched or selectively deposited in some manner (e.g., using conventional photolithographic and etching processes) prior to the deposition of the thiol. The thiol would selectively bond to the gold-coated regions of the donor film surface. Other methods involve the deposition of an initial organosilane SAM, followed by patternwise photo-deposition of that layer to cleave the Si—C bond, leaving Si—OH groups at the surface, and then depositing a second SAM to attach only at the Si—OH terminated regions.

Using the techniques described above, a LITI donor film without a transfer layer can be prepared with a SAM pattern so that coatings of a polymer blend will self-organize into a phase separated transfer layer with an ordered pattern corresponding to the underlying SAM pattern. SAMs may be used on an organic light emitting diode (OLED) device surface to direct the phase separation of light-emitting polymer blends. The SAMs are created directly on the surface of the hole injection material of an OLED device by microcontact printing. A polymer blend layer is spin-coated on top of a two-dimensional pattern with a periodicity of 4 microns, for example, to achieve self-organization. The pattern includes alternating hydrophobic and hydrophilic surfaces introduced by microcontact printing. The polymer blend, after being coated onto the SAM, would be dried to remove solvent, and then annealed to assist the phase separation process. This particular SAM is described in Fichet et al., "Self-Organized Photonic Structures in Polymer Light-Emitting Diodes," Adv. Mater, vol. 16, no. 21 (Wiley-VCH Verlag GmbH & Co. KGaA, Weinheim 2004), which is incorporated herein by reference.

A SAM on a LITI donor film can be used to control wetting of a solution coated layer. The process to create the SAM can be similar to that described above or, additionally, it can involve traditional printing plate technology, for example patternwise photoacid generation and subsequent acid-catalyzed reaction of a polymer. A pure hydrophobic or hydrophilic coating is then applied. The coating wets only the region with similar surface energy. The result is a layer having a pattern of nanostructures or microstructures with the desired distribution of voids, grooves, channels, or holes.

Examples of phase separation in films, and other patterning or printing techniques, are described in the following papers, all of which are incorporated herein by reference as if fully set forth: A. Karim et al., "Phase-Separation-Induced Surface Patterns in Thin Polymer Blend Films," Macromolecules 1998, vol. 31, pp. 857-62 (American Chemical Society 1998); A. Karim et al., "Phase Separation of Ultrathin Polymer Blend Films on Patterned Substrates," Physical Review E, vol. 57, no. 6 (The American Physical Society 1998); Cheng et al., "Templated Self-Assembly of Block Copolymers: Top-Down Helps Bottom-Up," Adv. Mater, vol. 18, pp. 2505-2521 (Wiley-VCH Verlag GmbH & Co. KgaA, Weinheim 2006); Wu et al., "Toward Large-Scale Alignment of Electrohydrodynamic Patterning of Thin Polymer Films," Adv. Funct. Mater, vol. 16, pp. 1992-1999 (Wiley-VCH Verlag GmbH & Co. KGaA, Weinheim 2006); and Springer Handbook of Nanotechnology, ISBN 3-540-01218-4, pp. 185-200 (Springer-Verlag Berlin Heidelberg 2004).

FIG. 6a is a diagram illustrating a LITI donor film 40 having a substrate 42, LTHC layer 44, a transfer layer 45, and a pattern-directing layer 43 comprised of a pattern of hydrophilic regions 46 and hydrophobic regions 48. In this case (FIG. 6a), the material of the transfer layer 45 is a polar material, which will attach only to the hydrophilic regions 46. FIG. 6b is a diagram illustrating a LITI donor film 40 having a substrate 42, LTHC layer 44, a transfer layer 45, and a pattern-directing layer 43 comprised of a pattern of hydrophilic regions 46 and hydrophobic regions 48. In this case (FIG. 6b), the material of the transfer layer 45 is a nonpolar material, which will attach only to the hydrophobic regions 48. In film 40, substrate 42 and LTHC layer 44 may correspond with substrate 12 and LTHC layer 14 as described above, and film 40 can optionally include an interlayer such as interlayer 16 between the LTHC layer and pattern-directing layer. Also, film 40 can be constructed and imaged using the exemplary methods described above. Additional exemplary methods may be found in Section 4.3.9 entitled "Printing Plates for Digital Imaging" in Handbook of Print Media, Technologies and Production Methods, ISBN 3-540-67326-1 (Springer-Verlag Berlin Heidelberg 2001). Upon imaging film 40 to a permanent receptor using the exemplary imaging methods described above, at least a portion of the hydrophobic regions remaining after patterning are transferred to the receptor and the pattern of the hydrophobic regions in the transferred portion preferably remains substantially intact on the receptor subsequent to the transfer. The pattern-directing layer of film 40 can include any two-dimensional pattern of hydrophilic and hydrophobic regions. These regions can be patterned using SAMs as described above, for example.

FIG. 7a is a diagram illustrating a LITI donor film 50 having a substrate 52, LTHC layer 54, a transfer layer 56, and a pattern-directing layer 57 comprised of a pattern of positively or negatively charged regions 58. FIG. 7b is a diagram illustrating the LITI donor film 50 having a templated transfer layer patterned by the pattern-directing layer 57 where the positively or negatively charged regions 58 through treatment of the film having formed an electrostatic pattern in the transfer layer 56. Pattern-directing layer 57 can be implemented with, for example, an organic photoconductor material. When exposed to light of a sufficient intensity and duration, the organic photoconductor material creates an electrostatic pattern in transfer layer 56, and the electrostatic pattern can be used for a variety of printing applications. In film 50, substrate 52 and LTHC layer 54 may correspond with substrate 12 and LTHC layer 14 as described above, and film 50 can optionally include an interlayer such as interlayer 16 between the LTHC layer and pattern-directing layer. Also, film 50 can be constructed and imaged using the exemplary methods described above. Upon imaging film 50 to a permanent receptor using the exemplary imaging methods described above, at least a portion of the positively or negatively charged regions are transferred to the receptor and the electrostatic pattern of the regions in the transferred portion preferably remains substantially intact on the receptor subsequent to the transfer. The pattern-directing layer of film 50 can include any two-dimensional pattern of detectable positively or negatively charged regions.

In film 50, regions 58 can alternatively create a charge pattern directly on an image carrier, referred to as ionography, which combines charge pattern generation and imaging. As another alternative for film 50, regions 58 can create a magnetic pattern for imaging, referred to as magnetography. Ionography and magnetography printing technologies are described in the following text, which is incorporated herein by reference: Handbook of Print Media, Technologies and Production Methods, ISBN 3-540-67326-1, pp. 675-710 (Springer-Verlag Berlin Heidelberg 2001).

Figure 8A:
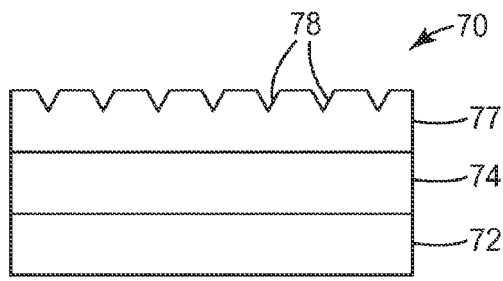
FIG. 8a is a diagram illustrating a LITI donor film having a series of recessed features as the pattern-directing layer.
Figure 8B:
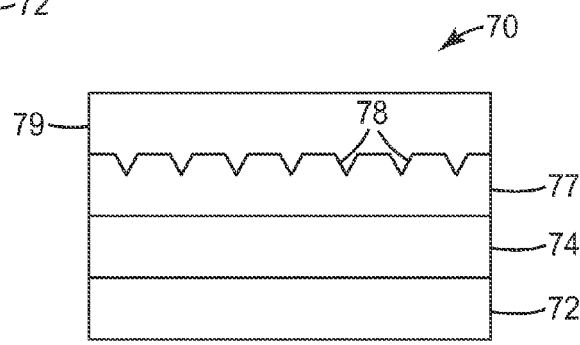
FIG. 8b is a diagram illustrating the donor film of FIG. 8a after patterned by the series of recessed features.
Figure 8C:
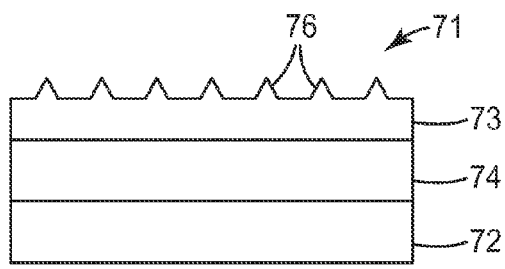
FIG. 8c is a diagram illustrating a LITI donor film having a series of raised features as the pattern-directing layer.
Figure 8D:
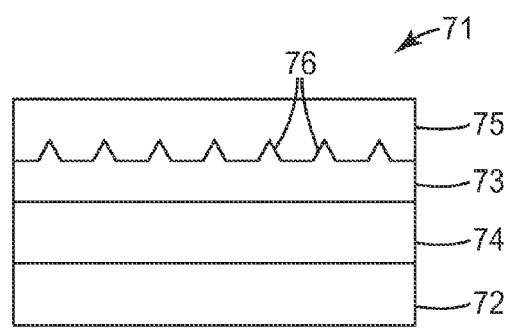
FIG. 8d is a diagram illustrating the donor film of FIG. 8c after patterned by the series of raised features.

FIG. 8a is a diagram illustrating a LITI donor film 70 having a substrate 72, LTHC layer 74, and a pattern-directing layer 77 comprised of a pattern of a series of recessed features 78. FIG. 8b is a diagram illustrating the LITI donor film 70 having a templated transfer layer patterned by the pattern-directing layer 77 where a transfer layer 79 has been applied and substantially conforms on one surface to the recessed features 78. FIG. 8c is a diagram illustrating a LITI donor film 71 having a substrate 72, LTHC layer 74, and a pattern-directing layer 73 comprised of a pattern of a series of raised features 76. FIG. 8d is a diagram illustrating the LITI donor film 71 having a templated transfer layer patterned by the pattern-directing layer 73 where a transfer layer 75 has been applied and substantially conforms on one surface to the raised features 76. The transfer layers 75 and 79 can be applied to the donor films using the techniques described above, for example.

In films 70 and 71, substrate 72 and LTHC layer 74 may correspond with substrate 12 and LTHC layer 14 as described above, and film 70 can optionally include an interlayer such as interlayer 16 between the LTHC layer and pattern-directing layer. Also, films 70 and 71 can be constructed and imaged using the exemplary methods described above.

A tool having microstructured or nanostructured features can be used to form the raised features 76 or recessed features 78 in the pattern-directing layer 73 or 77, respectively. The tool is typically formed from a machined metal material and can be made using, for example, wire electrical discharge machining, diamond turning machining, flycutting, milling, grinding, engraving, or etching. The tool may be placed against a layer on films 70 and 71 using pressure and heat to form the corresponding microstructured or nanostructured features on a surface of the film, and then the tool is removed before imaging the film. The raised or recessed features can be formed in other ways as well.

Upon imaging films 70 or 71 to a permanent receptor using the exemplary imaging methods described above, at least a portion of the raised and recessed features are transferred to the receptor and the pattern of the raised and recessed features in the transferred portion preferably remains substantially intact on the receptor subsequent to the transfer. The pattern-directing layers of films 70 and 71 can include any two-dimensional pattern of microstructured or nanostructured raised features, recessed features, or a combination of raised and recessed features, and those features can generate spatially varying physical properties in the film.

Examples of donor films having a structured surface and methods to structure the surface are described in U.S. patent application Ser. No. 11/551,276, entitled "Structured Thermal Transfer Donors" and filed Oct. 20, 2006, which is incorporated herein by reference.

Figure 9:
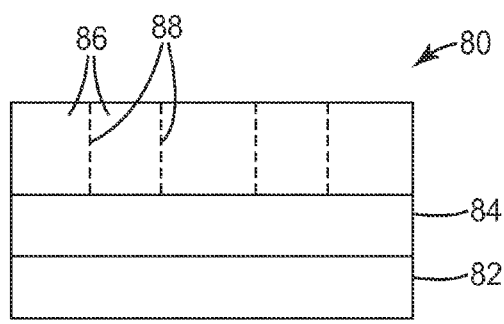
FIG. 9 is a diagram illustrating a LITI donor film having a pattern of spatially properties resulting from the pattern-directing layer.

FIG. 9 is a diagram illustrating a LITI donor film 80 having a substrate 82, LTHC layer 84, and a transfer layer comprised of a pattern of spatially varying properties such as regions 86 separated by templated areas 88. These spatially varying properties can result from use of the pattern-directing layers described above, for example. In film 80, substrate 82 and LTHC layer 84 may correspond with substrate 12 and LTHC 14 as described above, and film 80 can optionally include an interlayer such as interlayer 16 between the LTHC layer and pattern-directing layer. Also, film 80 can be constructed and imaged using the exemplary methods described above. Upon imaging film 80 to a permanent receptor using the exemplary imaging methods described above, at least a portion of the property regions are transferred to the receptor and the pattern of the property regions in the transferred portion preferably remains substantially intact on the receptor subsequent to the transfer. The pattern-directing layer of film 80 can include any two-dimensional pattern of regions having spatially varying optical properties such as reflectivity, absorption, polarization, or index of refraction, spatially varying mechanical properties such as roughness and surface energy, spatially varying electrical properties, or spatially varying chemical properties. The varying electrical properties may result from, for example, the electrostatic patterns or charge patterns as described above, and such properties may be useful in a donor film having one or more of the following as at least part of the transfer layer: electrically active polymers; OLED materials; hole transport materials; or electron transport materials.

The invention claimed is:

1. A patterned laser induced thermal imaging (LITI) donor film comprising:
   a substrate having a surface;
   a light-to-heat conversion layer applied to the surface of the substrate; and
   a pattern-directing layer applied to the light-to-heat conversion layer, wherein the pattern-directing layer causes patterning of a transfer layer applied to the pattern-directing layer, wherein at least a portion of the transfer layer is capable of transfer to a permanent receptor without substantial transfer of the pattern-directing layer, wherein a pattern of the transfer layer in the transferred portion remains substantially intact on the receptor subsequent to the transfer, and
   wherein the transfer layer comprises an organic light emitting diode (OLED) material.

2. A patterned laser induced thermal imaging (LITI) donor film comprising:
   a substrate having a surface;
   a light-to-heat conversion layer applied to the surface of the substrate; and
   a pattern-directing layer applied to the light-to-heat conversion layer, wherein the pattern-directing layer causes patterning of a transfer layer applied to the pattern-directing layer, wherein at least a portion of the transfer layer is capable of transfer to a permanent receptor without substantial transfer of the pattern-directing layer, wherein a pattern of the transfer layer in the transferred portion remains substantially intact on the receptor subsequent to the transfer, and wherein the pattern of the pattern-directing layer corresponds to a photonic structure.

3. A patterned laser induced thermal imaging (LITI) donor film comprising:

a substrate having a surface;

a light-to-heat conversion layer applied to the surface of the substrate; and a pattern-directing layer applied to the light-to-heat conversion layer, wherein the pattern-directing layer causes patterning of a transfer layer applied to the pattern-directing layer, wherein at least a portion of the transfer layer is capable of transfer to a permanent receptor without substantial transfer of the pattern-directing layer, wherein a pattern of the transfer layer in the transferred portion remains substantially intact on the receptor subsequent to the transfer, wherein the pattern of the pattern-directing layer corresponds to a photonic structure, and wherein the transfer layer comprises at least two small molecule organic light emitting diode (OLED) materials substantially segregated into regions corresponding to the photonic structure.

4. A method of preparing an OLED device using a patterned laser induced thermal imaging (LITI) donor film, comprising:

providing a substrate having a surface and a light-to-heat conversion layer applied to the surface of the substrate;

applying a pattern-directing layer to the light-to-heat conversion layer;

applying a transfer layer to the pattern-directing layer, wherein the pattern-directing layer causes patterning of the transfer layer;

transferring at least a portion of the transfer layer to a device substrate without substantial transfer of the pattern-directing layer, wherein a pattern of the transfer layer in the transferred portion remains substantially intact on the receptor subsequent to the transfer; and fabricating a working organic light emitting diode (OLED) device using the patterned device substrate.

5. The method of claim 4, wherein the transfer layer comprises at least one of an electrically active polymer, an OLED material, a hole transport material, or an electron transport material.

6. A patterned laser induced thermal imaging (LITI) donor film comprising:

a substrate having a surface;

a light-to-heat conversion layer applied to the surface of the substrate; and a pattern-directing layer applied to the light-to-heat conversion layer, wherein the pattern-directing layer causes patterning of a transfer layer applied to the pattern-directing layer, wherein at least a portion of the transfer layer is capable of transfer to a permanent receptor without substantial transfer of the pattern-directing layer, wherein a pattern of the transfer layer in the transferred portion remains substantially intact on the receptor subsequent to the transfer, and wherein the pattern of the pattern-directing layer comprises a two-dimensional pattern of regions having varying indices of refraction.

7. A method of preparing a patterned laser induced thermal imaging (LITI) donor film, comprising:

providing a substrate having a surface and a light-to-heat conversion layer applied to the surface of the substrate; and applying a pattern-directing layer to the light-to-heat conversion layer, wherein the pattern-directing layer causes patterning of a transfer layer applied to the pattern-directing layer, wherein at least a portion of the transfer layer is capable of transfer to a permanent receptor without substantial transfer of the pattern-directing layer, wherein a pattern of the transfer layer in the transferred portion remains substantially intact on the receptor subsequent to the transfer, and wherein the pattern of the pattern-directing layer corresponds to a photonic structure.

8. An organic light emitting diode (OLED) device comprising the photonic structure made using the method of claim 7.

9. The method of claim 7, wherein the transfer layer comprises at least two small molecule organic light emitting diode (OLED) materials substantially segregated into regions corresponding to the photonic structure.

10. An article comprising a support substrate and a film of the at least two small molecule OLED materials made using the method of claim 9.

* * * * *